(12) United States Patent
Hobelsberger et al.

(10) Patent No.: US 8,536,839 B2
(45) Date of Patent: Sep. 17, 2013

(54) DEVICE AND METHOD FOR MONITORING AND/OR ANALYZING ROTORS OF ELECTRIC MACHINES IN OPERATION

(75) Inventors: Max Hobelsberger, Würenlingen (CH); Bernhard Mark, Waldshut (DE)

(73) Assignee: Alston Technology Ltd, Baden (CH)

( * ) Notice: Subject to any disclaimer, the term of this patent is extended or adjusted under 35 U.S.C. 154(b) by 0 days.

(21) Appl. No.: 13/089,119

(22) Filed: Apr. 18, 2011

(65) Prior Publication Data

US 2011/0234181 A1  Sep. 29, 2011

Related U.S. Application Data

(63) Continuation of application No. PCT/EP2009/063332, filed on Oct. 13, 2009.

(30) Foreign Application Priority Data

Oct. 22, 2008  (DE) .......................... 10 2008 043 103

(51) Int. Cl.
*H02K 11/00* (2006.01)
*G01R 31/34* (2006.01)
*G01R 27/28* (2006.01)

(52) U.S. Cl.
USPC .......................... 322/99; 324/765.01; 702/117

(58) Field of Classification Search
USPC ............... 322/99; 324/765, 765.01; 702/117
See application file for complete search history.

(56) References Cited

U.S. PATENT DOCUMENTS

| 4,390,835 | A | * | 6/1983 | Elkateb et al. | 324/539 |
| 4,814,700 | A | | 3/1989 | Krachanko | 324/765.01 |
| 4,851,766 | A | * | 7/1989 | Shiobara et al. | 324/765.01 |
| 4,982,147 | A | * | 1/1991 | Lauw | 318/729 |
| 4,994,684 | A | * | 2/1991 | Lauw et al. | 290/52 |
| 5,006,769 | A | | 4/1991 | Posedel | 318/434 |
| 5,115,200 | A | * | 5/1992 | Lahitte et al. | 324/718 |
| 5,477,163 | A | * | 12/1995 | Kliman | 324/756.06 |
| 5,514,978 | A | * | 5/1996 | Koegl et al. | 324/750.02 |
| 5,625,264 | A | * | 4/1997 | Yoon | 318/400.06 |
| 5,680,059 | A | | 10/1997 | Shiota et al. | 324/765.01 |
| 5,689,194 | A | | 11/1997 | Richards, II et al. | 324/765.01 |
| 5,786,708 | A | | 7/1998 | Premerlani et al. | 324/765.01 |
| 6,459,276 | B1 | | 10/2002 | Matthews et al. | 324/545 |
| 6,483,319 | B1 | * | 11/2002 | Kendig et al. | 324/551 |
| 7,345,456 | B2 | * | 3/2008 | Gibbs et al. | 322/19 |
| 7,423,412 | B2 | * | 9/2008 | Weng et al. | 322/20 |

(Continued)

FOREIGN PATENT DOCUMENTS

| DE | 1169577 C | 5/1964 |
| DE | 2108670 A1 | 9/1972 |

(Continued)

*Primary Examiner* — Pedro J Cuevas
(74) *Attorney, Agent, or Firm* — Volpe and Keonig, P.C.

(57) ABSTRACT

A method is provided for monitoring and/or analysis of electrical machines during operation. An electrical machine has at least one generator with a shaft, an exciter system and drive device that drives the shaft. In this case, a first signal, which describes a voltage across a rotor winding, and a second signal, which describes a current flowing through the rotor winding, are measured simultaneously. The two signals are supplied to an analysis unit. The signals are split into individual frequency components in the analysis unit. The impedance of the rotor winding is then determined in order to identify fault states in the electrical machine.

17 Claims, 4 Drawing Sheets

(56) References Cited

U.S. PATENT DOCUMENTS

| | | | |
|---|---|---|---|
| 7,583,039 B2* | 9/2009 | Zhong et al. | 318/400.07 |
| 7,638,999 B2* | 12/2009 | Kojovic et al. | 324/127 |
| 7,818,058 B2* | 10/2010 | Mentelos | 607/8 |
| 7,821,251 B2* | 10/2010 | Alfano et al. | 324/117 R |
| 8,005,637 B2* | 8/2011 | Bengtsson et al. | 702/117 |
| 8,027,182 B2* | 9/2011 | Abiko | 363/120 |
| 8,269,506 B2* | 9/2012 | Liang et al. | 324/537 |
| 8,352,204 B2* | 1/2013 | Morrison et al. | 702/75 |
| 2005/0248430 A1 | 11/2005 | Dupraz et al. | 336/200 |
| 2006/0164045 A1 | 7/2006 | Gibbs et al. | 322/19 |
| 2007/0177314 A1* | 8/2007 | Weng et al. | 361/20 |
| 2007/0236208 A1* | 10/2007 | Kojovic et al. | 324/127 |
| 2008/0051845 A1 | 2/2008 | Mentelos | 607/28 |
| 2008/0231217 A1* | 9/2008 | Zhong et al. | 318/400.07 |
| 2009/0237041 A1* | 9/2009 | Abiko | 323/234 |
| 2009/0254297 A1* | 10/2009 | Bengtsson et al. | 702/117 |
| 2010/0299090 A1* | 11/2010 | Hobelsberger et al. | 702/58 |
| 2011/0025304 A1* | 2/2011 | Lint et al. | 324/150 |
| 2011/0025305 A1* | 2/2011 | Lint et al. | 324/150 |
| 2011/0109301 A1* | 5/2011 | Johnson et al. | 324/119 |
| 2011/0184675 A1* | 7/2011 | White et al. | 702/61 |
| 2012/0019186 A1* | 1/2012 | Wagner et al. | 318/696 |

FOREIGN PATENT DOCUMENTS

| | | |
|---|---|---|
| DE | 19507826 A1 | 8/1995 |
| DE | 19780321 B4 | 4/1998 |
| DE | 19742622 A1 | 4/1999 |
| DE | 19823787 A1 | 12/1999 |
| DE | 102004009046 B3 | 5/2005 |
| DE | 102005050486 A1 | 5/2007 |
| EP | 0391181 A2 | 10/1990 |
| EP | 1427082 A2 | 6/2004 |
| EP | 1936393 A1 | 6/2008 |
| GB | 1001399 A | 8/1965 |
| JP | 11083686 A | 3/1999 |
| JP | 11326469 A | 11/1999 |
| WO | 0069062 A1 | 11/2000 |

* cited by examiner

DEVICE AND METHOD FOR MONITORING AND/OR ANALYZING ROTORS OF ELECTRIC MACHINES IN OPERATION

RELATED APPLICATIONS

This application is a Continuation of PCT/EP2009/063332, filed Oct. 13, 2009, which claims priority to German Patent Application No. 10 2008 043 103.6, filed Oct. 22, 2008, the entire contents of all of which are incorporated by reference as if fully set forth.

FIELD OF INVENTION

The present invention relates to an apparatus and a method for monitoring and/or analysis of fault states of electrical machines during operation. In this case, the electrical machine has at least one generator with a shaft, an exciter system and drive means for driving this shaft. In particular, the invention relates to an apparatus for use in power stations.

BACKGROUND

Electrical machines, in particular large electrical machines such as those used in power stations, should be monitored continuously and/or analyzed from time to time, in order to identify fault states in good time and to avoid uncontrolled failures, thus ensuring smooth operation.

WO 00/69062 discloses a system for monitoring a machine, in which the system emits a warning signal when fault states occur. In this instance, the system comprises a plurality of sensors, which record various parameters. For example, the shaft ground current, the shaft voltage, the extent of the change in the shaft ground current and the extent of the change in the shaft voltage are measured. An evaluation system produces the warnings as a function of the change in the shaft ground current, the change in the shaft voltage and the average shaft ground current. This document furthermore discloses that these various measured values can be recorded as a function of time.

EP 0 391 181 discloses an arrangement for detection of turn shorts in the rotor winding of electrical machines. This arrangement can be used to record the state of an electrical machine over a relatively long time period, although individual measurements can also be carried out. In this case, the shaft voltage is recorded between the machine shaft and ground. The harmonics which occur in the shaft voltage are used as an evaluation criterion. When there are no turn shorts in the rotor, the distribution of the ampere turns on the rotor circumference is symmetrical, and the rotor field of the machine has only the odd-numbered harmonics. If a turns short now occurs, then the rotor field also contains the even-numbered harmonics, since this results in asymmetry in the circumferential distribution of the ampere turns.

A further method, which is known to a person skilled in the art, is to measure the DC voltage resistance of the rotor winding during operation. This method can be used, for example, to measure the temperature in the rotor winding. However, only the equivalent resistance with a DC voltage is determined in this case.

SUMMARY

The present disclosure is directed to a method for monitoring and/or analysis of electrical machines. The electrical machine has at least one generator with a shaft, an exciter system and a drive device that drives the shaft. The method includes measuring a first signal, which at least indirectly describes a voltage across a rotor winding, and simultaneously measuring a second signal, which at least indirectly describes a current flowing through the rotor winding, during operation. The method also includes supplying the first and second signals to an analysis unit; splitting the first and second signals into individual frequency components in the analysis unit and determining the impedance of the rotor winding in order to identify fault states in the electrical machine.

The disclosure is also directed to an apparatus for monitoring and/or analysis of an electrical machine during operation. The electrical machine including at least one generator with a shaft, an exciter system and a drive device that drives shaft. A first detector is provided, which is galvanically isolated from the electrical machine and measures a first signal, which at least indirectly describes a voltage across a rotor winding, and a second detector is provided, which is galvanically isolated from the electrical machine and measures a second signal, which at least indirectly describes a current flowing through the rotor winding. An analysis unit is provided, which splits the first and second signals into individual frequency components and determines the impedance of the rotor winding.

BRIEF DESCRIPTION OF THE DRAWINGS

The invention will be described in more detail in the following text with reference to the drawing, in which.

DETAILED DESCRIPTION OF THE PREFERRED EMBODIMENTS

Introduction to the Embodiments

Figure 1:
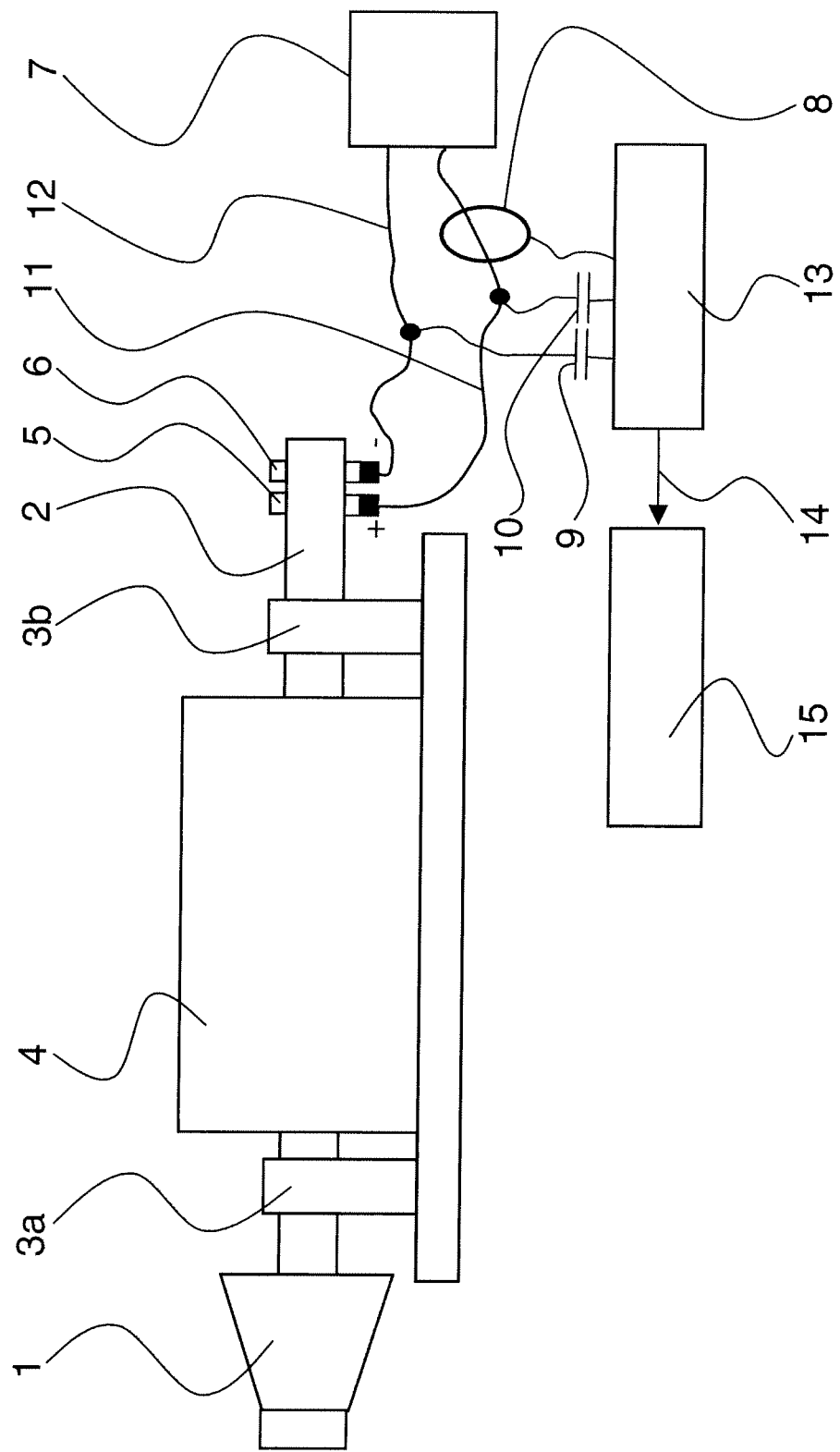
FIG. 1 shows a schematic illustration of a first embodiment of an apparatus for measuring the rotor winding impedance of an electrical machine.

Against the background of the above-mentioned prior art, the invention is based inter alia on the object of providing an apparatus and a method which detect fault states in a rotor, in particular in the windings of a rotor. A further aim is to also make it possible to use this determination, for example, to assess the state of the damper bars or of the damper cage of the rotor.

A further object of the present invention is to allow sudden changes in the impedance of the rotor to be recorded. A further aim is to correlate the sudden changes in the impedance with other events.

These objects are achieved by a method having the features of claim 1.

The proposed method is used for monitoring and/or for analysis of electrical machines during operation, wherein the electrical machine has at least one generator with a shaft, an exciter system (for producing the exciter field which rotates with the rotor and is generated by at least one rotor winding) and drive means for driving this shaft.

In this case, a first signal, which at least indirectly describes a voltage across a rotor winding, and a second signal, which at least indirectly describes a current flowing through the rotor winding, are measured simultaneously during operation. These two signals are supplied to an analysis unit. The signals are preferably split into individual frequency components in the analysis unit. The rotor winding impedance determined from these signals is then used to identify fault states in the electrical machine. The steps described above may also be carried out in a different sequence.

This is one of the advantages over the prior art because this provides, for example, results relating to alternating-current losses in the rotor in good time. Furthermore, important more extensive information, for example relating to the state of the damper cage, can be provided. A further advantage is that, in the case of turn shorts, the impedance changes to a greater extent than the DC voltage resistance of the rotor winding, which changes only to a lesser extent when turn shorts occur.

The first signal and the second signal are preferably measured via the electrical conductors which connect the sliding contacts of an exciter system on the rotor to the exciter. This is for the situation where the supply of the rotor windings with current and voltage for producing the rotor field is transmitted via a contact (for example contact brushes) from an external, nonrotating supply unit, the exciter, to the rotating part (shaft), and is then connected to the rotor windings via conductors which are arranged on or in the shaft.

A further object of the present invention is to monitor the impedance of generators having a rotating excitation device. In other words, the proposed method can also be used for brushless excitation, where a rotating winding is arranged on the shaft, remote from the actual generator, on the rotor, surrounded by an arrangement which produces a static field. The AC voltage and alternating current which are produced in this winding which rotates with the shaft are rectified by a rectifier which is arranged on the shaft (and therefore also rotates), and are then transmitted to the actual rotor winding in order to produce the rotor field.

For this purpose, this first signal and the second signal are preferably measured in the stationary part (that is to say in or on the arrangement which provides a static field) of a brushless exciter system.

However, the first signal and the second signal can also preferably be measured in the rotating part of a brushless exciter system, and can be transmitted, without the use of wires, by means of a telemetry unit which is arranged on the rotor, from the measurement point to an analysis unit which is formed with an appropriate receiver unit. This surprisingly simplifies the monitoring of the relationships in the rotating system, because the transmission unit, if it is designed without use of wires, is correspondingly designed without contacts in precisely the same way as the brushless excitation, and is therefore considerably simpler, not only in terms of installation and maintenance, but also in operation.

The signals can be recorded during operation of the electrical machine. The rotation speed may be constant or variable during operation.

The impedance is displayed graphically, in particular by means of a display unit. This display makes it possible to visualize a change in the impedance. Fault states can thus be identified and analyzed.

Furthermore, the impedance is monitored and evaluated automatically, such that fault states can be identified automatically.

The impedance is displayed and analyzed as a function of the time and/or of the frequency.

The method according to the present invention allows various fault states to be identified. In this case, the fault states relate, for example, to at least one fault state selected from the following group: turn shorts in the rotor winding; state of the damper bars; state of the damper cages; torsional oscillations, torsional vibrations and/or the state of the stator.

The method is preferably carried out by means of an apparatus as claimed in claim 11.

DETAILED DESCRIPTION

One possible exemplary embodiment will be described with reference to FIG. 1. The drawing is intended only to illustrate the preferred exemplary embodiment, and not for limitation thereto or of the claims.

FIG. 1 schematically illustrates an electrical machine in which a turbine 1 is arranged as drive means on one side of a generator 4, with the turbine 1 and the generator 4 being connected by means of a shaft 2 or a shaft train. The shaft 2 is borne on at least two bearings 3, with a first bearing 3a being arranged between the turbine 1 and the generator 4, and a second bearing 3b being arranged on the other side of the generator 4. The described arrangement should be understood as an example. It is obvious that, for example, a turbine can be arranged at both shaft ends, and that the generator can also be used as a motor.

The rotor winding in the generator 4 is excited by an exciter system 7 with an exciter via brush contacts on the rotor. The exciter system 7 is preferably a variable rectifier, which converts an alternating current to a direct current. The direct current, which is also referred to as the excitation current, is then applied to the rotor winding via cables 11, 12 and slipring contacts 5, 6. The excitation voltage and the excitation current as well are in a pulsating form. These pulsating signals can be used to determine the impedance.

The slipring contacts 5, 6 are arranged on the shaft 2. In the preferred exemplary embodiment, a first slipring contact 5 and a second slipring contact 6 are arranged in the area of the bearing 3b. The slipring contact 5 is the positive pole, and the slipring contact 6 is the negative pole.

The method according to the present invention is used to determine the impedance Z of a rotor winding. For this purpose a signal S1 and a signal S2 (FIG. 4) are recorded in a first step.

The signal S1 is the voltage U which is measured across the rotor winding. In particular, the AC voltage component of this rotor winding voltage is measured. The signal S2 is the current I which flows through the rotor winding. In particular, the alternating-current component of this rotor winding current I is measured. S1 and S2 are measured simultaneously.

Figure 4:
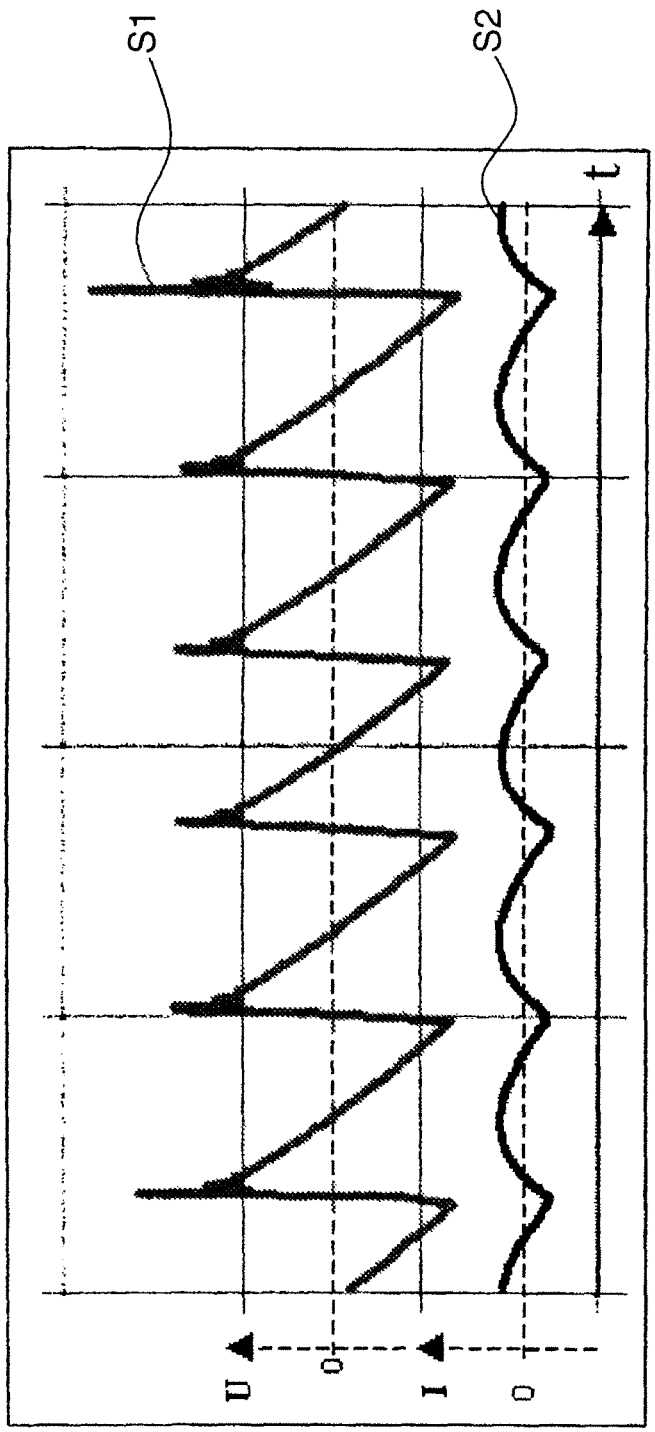
FIG. 4 shows an illustration of an example of the profile of the excitation voltage and of the excitation current.

FIG. 4 shows an example of the excitation voltage I (S2) and of the excitation current U (S1) as a function of the time t.

The two signals S1 and S2 are then supplied to an analysis unit 13, and are split into individual frequency components by means of this analysis unit 13. This is preferably done by Fourier transformation. The individual frequency components are then related to one another in a manner known per se, in particular with the impedance Z being determined.

The impedance Z can be displayed on the basis of magnitude and phase or in complex form as reactance and resistance at various frequencies, by means of a display unit 15. The frequency and response is therefore determined on the basis of magnitude and phase. A change in the impedance Z can be visualized by this display.

This makes it possible to identify and analyze fault states. The impedance Z is preferably displayed as a function of the time t and/or of the frequency v.

It is also possible for the signal to monitor and evaluate the impedance Z systematically and automatically, thus allowing fault states to be identified quickly.

These measurements can either be carried out during steady-state operation, that is to say when the electrical machine is at a constant rotation speed, or else during variable operation, that is to say when the rotation speeds of the electrical machine are variable. In particular, measurements can be carried out while starting up and shutting down the electrical machine.

The rotor winding voltage is in a highly pulsating form, in particular in the case of installations with static excitation devices. The large relatively high-frequency signal content of the pulsating excitation voltage allows the voltage components U (for example DC=400 V; AC=4000 V) and the current components I (for example DC=2000 A; AC=500 mA) to be measured over a wide frequency range, typically in the range from 1 Hz to 200 kHz.

Changes in the electrical characteristics of the rotor can be recorded by determining the rotor winding impedance Z. In particular, the method has the advantage that it can be used for relatively high-frequency signals, because winding shorts in the excitation winding and discontinuities in the damper cage actually have a greater effect in the case of relatively high-frequency signals. Relatively high-frequency signals are signals which are preferably at a frequency of $v=150$ Hz to $v=3000$ Hz.

Turn shorts in the rotor winding (the reactance becomes much less), the state of the damper bars, the state of the damper cages, torsional oscillations or torsional vibrations can be identified from the measured impedance Z.

In the event of turn shorts, the inductance of the excitation winding varies to a much greater extent than the DC resistance of the coil. This is an advantage of the present invention, because this allows fault states to be determined more accurately and reliably.

The short-circuit loop has a field-reducing effect, because of the demagnetizing effect of the short-circuit current. Therefore, the inductance decreases to a considerably greater extent than in the case of a coil which has only one turn less. The impedance therefore becomes more resistive.

Torsional oscillations and torsional vibrations of the machine rotor influence the determined impedance because of the back-EMF of the impedance characteristics of the rotor winding. Such oscillations and vibrations can likewise be recorded because of this influence.

The magnetic linking also makes it possible to draw conclusions about the magnetic state of the stator and of the entire magnetic circuit.

The measured values measured or determined using the method according to the present invention can also be recorded over a specific time period. Appropriate means must be provided for this purpose. The recordings allow subsequent evaluation, and can also provide indications of incipient fault states.

This method is preferably carried out by using an apparatus according to the present invention.

The measurement apparatus according to the present invention preferably has a first detector, a second detector, an analysis unit 13, also referred to as a measured data processing apparatus, and a display means 15.

The first detector is arranged such that it is galvanically isolated from the electrical machine and measures a first signal S1. In this case, the first signal S1 describes a voltage U across a rotor winding. The detector preferably has two coupling capacitors 9, 10.

The second detector is arranged such that it is galvanically isolated from the electrical machine and measures a second signal S2, with the second signal S2 describing a current I flowing through the rotor winding. The detector preferably has a coil 8.

The excitation current is passed from the exciter 7 to the sliding contacts 5, 6 via the cables 11, 12.

Furthermore, the two cables 11, 12 are connected to the measured data processing apparatus 13 via coupling capacitors 9, 10. The capacitors 9, 10 are used to measure the AC voltage components and have a capacitance of 1 µF to 0.01 µF. The voltage components are annotated U in the following text. The measured voltage components U are passed as the signal S1 to the measured data processing apparatus 13.

The cable 11 is passed through the coil 8. The coil 8 is preferably a measurement coil, and a Rogowski coil is particularly preferably used. However, it is also possible to pass the cable 12 through the coil 8. The current components are annotated I in the following text. The measured current components I are passed as the signal S2 to the measured data processing apparatus 13.

The measured data processing apparatus 13 is used to process the measured current components I and the measured voltage components U. An analog/digital converter is preferably also provided, and converts the signals S1 and S2 from an analog signal to a digital signal. The measured data processing apparatus 13 may be a measurement computer or else an electrical or electronic apparatus designed for this purpose. The processed data is then displayed to the electrical installation operator via the display unit 15. The data is preferably displayed as a function of the time t or of the frequency v. The display unit 15 may in this case be a commercially available screen. Other display means known to a person skilled in the art can likewise be used.

The measured values are advantageously recorded in a galvanically isolated form. The voltage U is tapped off capacitively across coupling capacitors 9, 10, and the current I is tapped off inductively via the coil 8. This makes it possible to use components which are resistant to high voltage.

The coupling capacitors preferably have a capacitance of 1 nF to 10 nF.

In a further embodiment, which is not illustrated, means are provided for storing the measured data and/or the processed data over a relatively long time period. In this case, a relatively long time period means days, months or even years.

Figure 2:
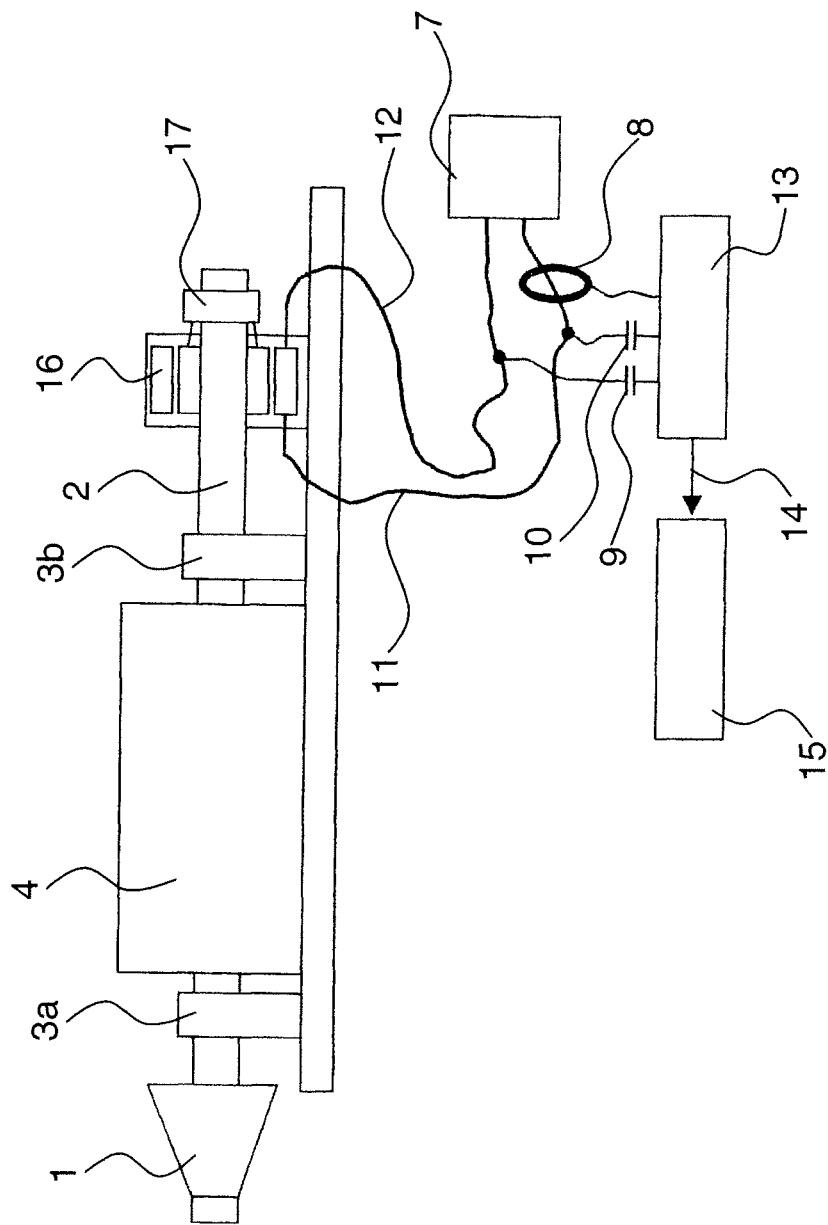
FIG. 2 shows a schematic illustration of a second embodiment of an apparatus for measuring the rotor winding impedance of an electrical machine.

In a further embodiment, which is illustrated in FIG. 2, the signals S1 and S2 are measured on the stationary part of a brushless exciter system 16. The first signal S1 describes a voltage U in the stationary part of the exciter system 16, and the second signal S2 describes a current I in the stationary part of the exciter system 16. Once again, these two signals can be used to calculate an impedance value, which makes it possible to deduce fault states mentioned in this document. In the illustrated embodiment, the two signals are measured via electrical conductors 11, 12, which connect the stationary part of the exciter system to the exciter 7.

Figure 3:
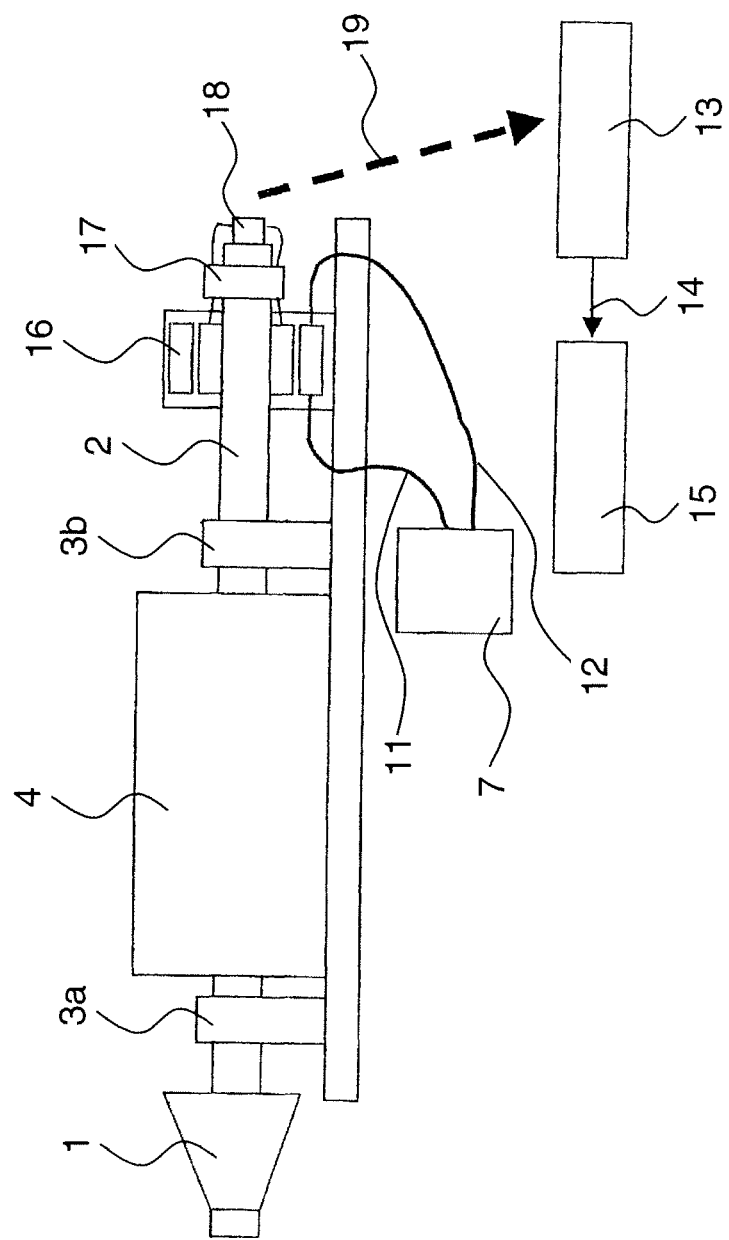
FIG. 3 shows a schematic illustration of a third embodiment of an apparatus for measuring the rotor winding impedance of an electrical machine.

In a further embodiment, which is shown in FIG. 3, the signals S1 and S2 are recorded in the area of the rotating part of the exciter system or of the rectifier 18. In this case, appropriate sensors are arranged in these areas, such that a voltage U and a current I can be recorded. The signals S1 and S2 are then transmitted by means of a telemetry unit, which is arranged fixed on the shaft 2, and rotates with this shaft 2, to a receiver unit, which is connected to the analysis unit 13. By way of example, it is feasible to transmit the signals S1 and S2 via a radio network or a wireless LAN. This embodiment has the advantage that defects in the rotating excitation device can also be detected, and that no sliding contacts need be provided in order to pass the signals on from the shaft 2. In this case, for example, faults in the rotating diodes, fuses or winding parts lead to a change in the voltage U and/or the current I, resulting in a change in the impedance.

Alternatively, the analysis unit can also be arranged in the area of the sensors or in the area of the rectifier, such that the radio link transmits the value of the impedance directly to an evaluation unit.

LIST OF REFERENCE SYMBOLS

1 Turbine, drive device
2 Shaft
3a, 3b Shaft bearing
4 Generator
5 Slipring (positive pole)
6 Slipring (negative pole)
7 Exciter system with brushes
8 Coil, Rogowski coil
9 Capacitor
10 Capacitor
11 Cable
12 Cable
13 Analysis unit
14 Signal transmission cable for results
15 Display unit, trending system
16 Brushless exciter system
17 Rectifier
18 Sensors
19 Radio link

What is claimed is:

1. A method for monitoring and/or analysis of electrical machines, wherein the electrical machine has at least one generator with a shaft, an exciter system and a drive device that drives the shaft, the method comprising:
    measuring a first signal, which at least indirectly describes the operating voltage across a rotor winding, and simultaneously measuring a second signal, which at least indirectly describes the operating current flowing through the rotor winding, during operation;
    supplying the first and second signals to an analysis unit;
    splitting the first and second signals into individual frequency components in the analysis unit; and
    determining the impedance of the rotor winding in order to identify fault states in the electrical machine.

2. The method as claimed in claim 1, wherein the first signal and the second signal are measured via the electrical conductors which connect sliding contacts on the shaft, to the exciter.

3. The method as claimed in claim 1, wherein the first signal and the second signal are measured in a stationary part of a brushless exciter system, in particular via electrical conductors which connect the stationary part to the exciter.

4. The method as claimed in claim 1, wherein the first signal and the second signal are measured in a rotating part of a brushless exciter system and are transmitted wirelessly, by a telemetry unit which is arranged on the shaft, from the measurement point to an analysis unit which is formed with an appropriate receiver unit.

5. The method as claimed in claim 1, wherein the signals are recorded during operation of the electrical machine, with the rotation speed being constant or variable during the operation of the electrical machine.

6. The method as claimed in claim 1, wherein the impedance is displayed graphically, in particular by a display unit, in which case a change in the impedance can be visualized by the display unit, such that fault states can be identified and/or analyzed.

7. The method as claimed in claim 1, wherein the impedance is monitored and evaluated automatically, such that fault states can be identified automatically.

8. The method as claimed in claim 1, wherein the impedance is displayed on a display device and analyzed as a function of time and/or of frequency.

9. The method as claimed in claim 1, wherein the fault states relate to at least one fault state selected from the following: turn shorts in the rotor winding; state of the damper bars; state of the damper cages; torsional oscillations, torsional vibrations or the state of the stator.

10. The method as claimed in claim 1, wherein only the alternating components of the voltage and of the current are recorded.

11. An apparatus for monitoring and/or analysis of an electrical machine during operation, wherein the electrical machine comprising at least one generator with a shaft, an exciter system and a drive device that drives shaft, wherein a first detector is provided, which is galvanically isolated from the electrical machine and measures a first signal, which at least indirectly describes the operating voltage across a rotor winding, and a second detector is provided, which is galvanically isolated from the electrical machine and measures a second signal, which at least indirectly describes the operating current flowing through the rotor winding, and an analysis unit is provided, which splits the first and second signals into individual frequency components and determines the impedance of the rotor winding.

12. The apparatus as claimed in claim 11, wherein the first signal and the second signal are measured via electrical conductors which connect sliding contacts on the shaft to the exciter.

13. The apparatus as claimed in claim 11, wherein the first signal and the second signal are measured in a stationary part of a brushless exciter system, via electrical conductors which connect the stationary part to the exciter.

14. The apparatus as claimed in claim 11, wherein the first signal and the second signal are measured in a rotating part of a brushless exciter system and are transmitted wirelessly, by a telemetry unit which is arranged on the shaft, from the measurement point to an analysis unit which is formed with an appropriate receiver unit.

15. The apparatus as claimed in claim 11, wherein a display unit is provided, by which the impedance can be displayed graphically, in which case a change in the impedance can be visualized by the display, such that fault states can be analyzed.

16. The apparatus as claimed in claim 11, wherein the detectors record only alternating components of the voltage and of the current.

17. The apparatus as claimed in claim 11, wherein the first detector for the measurement of the voltage has coupling capacitors which capacitively tap off the voltage, and the second detector for the measurement of the current has a Rogowski coil, which inductively taps off the current.

* * * * *